(12) United States Patent
Tsukagoshi (10) Patent No.: US 11,024,563 B2
(45) Date of Patent: Jun. 1, 2021

(54) SEMICONDUCTOR DEVICE AND MANUFACTURING METHOD THEREOF

(71) Applicant: ABLIC Inc., Chiba (JP)

(72) Inventor: Koji Tsukagoshi, Chiba (JP)

(73) Assignee: ABLIC Inc., Chiba (JP)

(*) Notice: Subject to any disclaimer, the term of this patent is extended or adjusted under 35 U.S.C. 154(b) by 2 days.

(21) Appl. No.: 16/351,522

(22) Filed: Mar. 13, 2019

(65) Prior Publication Data

US 2019/0287882 A1    Sep. 19, 2019

(30) Foreign Application Priority Data

Mar. 15, 2018 (JP) .............................. JP2018-047826

(51) Int. Cl.
*H01L 23/495* (2006.01)
*H01L 23/00* (2006.01)
*H01L 21/56* (2006.01)
*H01L 21/48* (2006.01)
*H01L 23/31* (2006.01)

(52) U.S. Cl.
CPC .... *H01L 23/49513* (2013.01); *H01L 21/4828* (2013.01); *H01L 21/561* (2013.01); *H01L 21/565* (2013.01); *H01L 23/315* (2013.01); *H01L 23/49548* (2013.01); *H01L 24/29* (2013.01); *H01L 24/49* (2013.01); *H01L 24/73* (2013.01); *H01L 24/96* (2013.01); *H01L 2224/73265* (2013.01)

(58) Field of Classification Search
CPC ............................................ H01L 2924/00014
See application file for complete search history.

(56) References Cited

U.S. PATENT DOCUMENTS

| 6,435,028 B1* | 8/2002 | Nagahara | B81C 1/0023 |
| | | | 73/514.01 |
| 8,004,078 B1* | 8/2011 | Song | H01L 24/83 |
| | | | 257/701 |
| 2006/0049493 A1* | 3/2006 | Lee | H01L 23/49524 |
| | | | 257/666 |

FOREIGN PATENT DOCUMENTS

| JP | 2003309241 | 10/2003 |
| JP | 2003309242 | 10/2003 |

* cited by examiner

*Primary Examiner* — Thao P Le
(74) *Attorney, Agent, or Firm* — JCIPRNET (57) ABSTRACT

A semiconductor device includes: a die pad; a semiconductor chip mounted on the die pad; a lead having an outer lead part and an inner lead par which is set up by a lead leg part extending from the outer lead part; an encapsulating resin sealing the die pad, the semiconductor chip, and the lead so that the lead is partially exposed; a support resin part provided on a bottom surface of the inner lead part, the support resin part being a portion of the encapsulating resin; and a notch part where the encapsulating resin is absent, and locating in a region surrounded by a bottom surface of the support resin part, an outer side surface of the outer lead part and an outer side surface of the lead leg part.

12 Claims, 6 Drawing Sheets

SEMICONDUCTOR DEVICE AND MANUFACTURING METHOD THEREOF

CROSS-REFERENCE TO RELATED APPLICATION

This application claims the priority of Japan patent application serial no. 2018-047826, filed on Mar. 15, 2018. The entirety of the above-mentioned patent application is hereby incorporated by reference herein and made a part of this specification.

BACKGROUND OF THE INVENTION

Technical Field

The invention relates to a non-lead type semiconductor device and a manufacturing method thereof.

Description of Related Art

In semiconductor packages, miniaturization and thinning are required according to target devices. In reduction of a package mounting area by reduction of lead length, selection of a non-lead type is one way of miniaturization. Japanese Patent Application Laid-Open No. 2003-309241 describes a non-lead type semiconductor package in which an encapsulating resin is sealed by batch molding.

Figure 7A:
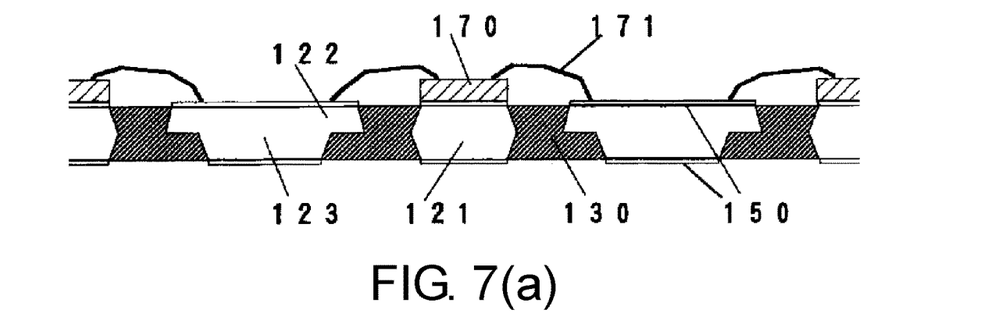
FIG. 7(a) to FIG. 7(d) are cross-sectional views illustrating a manufacturing method of a package having a non-lead structure in prior art.
Figure 7B:
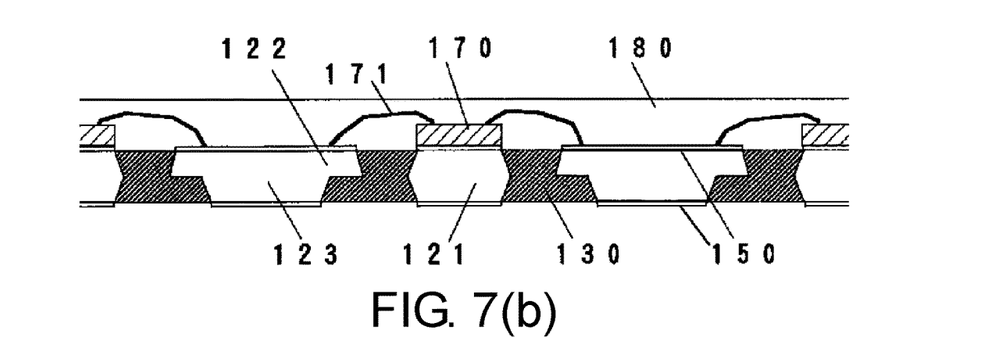
Figure 7C:
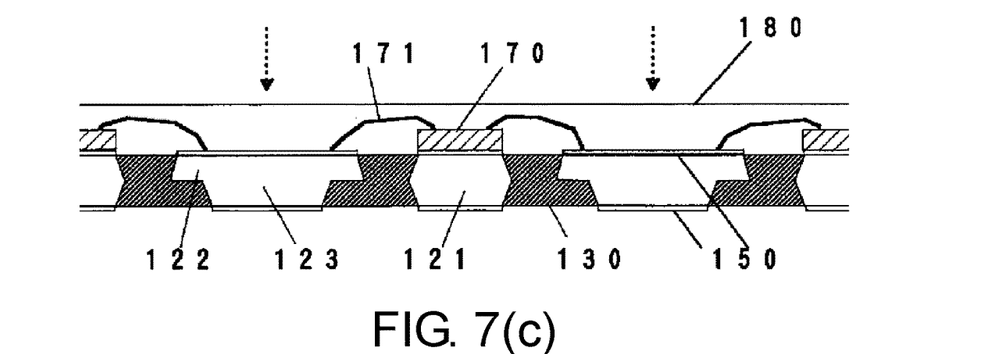
Figure 7D:
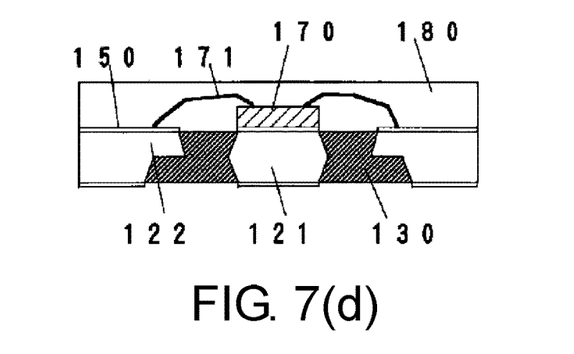

FIG. 7(d) illustrates a semiconductor device having a non-lead type semiconductor package in prior art. The conventional non-lead type semiconductor package has a form in which a die pad 121 and a lead 122 are bonded with a resin 130, and a semiconductor element 170 mounted on the die pad 121 and the lead 122 are electrically connected via a bonding wire 171 and then sealed with a encapsulating resin 180. An outer surface of the lead 122 and a side surface of the encapsulating resin 180 are constituted to form the same plane.

As illustrated in FIG. 7(a), in this method of manufacturing a semiconductor package, the semiconductor package has the form in which an overhanging part of the lead 122 is embedded in the resin 130 and a bottom surface of the lead 122 is exposed from the resin 130. The semiconductor element 170 is mounted on the die pad 121 of a lead frame in which the die pad 121 and the lead 122 are disposed to be spaced apart and are bonded with the resin 130, and the semiconductor element 170 is electrically connected to the lead 122. Next, the lead frame with semiconductor elements is sealed with the encapsulating resin 180 as illustrated in FIG. 7(b), the encapsulating resin 180 and the lead 122 are cut by dicing as illustrated in FIG. 7(c), and thereby individual pieces of semiconductor packages illustrated in FIG. 7(d) are obtained.

In the lead 122 of the semiconductor package described in Japanese Patent Application Laid-Open No. 2003-309241, a thin-shaped overhanging part for preventing the lead 122 from falling off is provided to be embedded in the resin 130, and a planar area of an upper surface of the lead 122 including the overhanging part is larger than a planar area of the bottom surface of the lead 122 exposed from the resin 130 in a plan view, which is a factor that inhibits miniaturization. Further, when this semiconductor package is mounted on a substrate, a solder fillet is formed on the side surface of the lead 122, which causes a mounting area to be even larger than the planar area of the semiconductor package.

SUMMARY OF THE INVENTION

The present invention provides a semiconductor device having a small mounting area while a lead is prevented from falling off from an encapsulating resin and a manufacturing method thereof.

A semiconductor device according to one embodiment of the invention includes a die pad, a semiconductor chip mounted on the die pad, a lead having an outer lead part and an inner lead par which is set up by a lead leg part extending from the outer lead part, an encapsulating resin sealing the die pad, the semiconductor chip, and the lead so that the lead is partially exposed, a support resin part provided on a bottom surface of the inner lead part, the support resin part being a portion of the encapsulating resin, and a notch part where the encapsulating resin is absent, and locating in a region surrounded by a bottom surface of the support resin part, an outer side surface of the outer lead part, and an outer side surface of the lead leg part.

A manufacturing method of a semiconductor device according to one embodiment of the invention includes preparing a lead frame having a die pad, and a lead disposed around the die pad and constituted by an outer lead part and an inner lead part which is set up by a lead leg part extending from the outer lead part, preparing a mold having a lower mold protrusion at a position corresponding to the lead, mounting a semiconductor chip on the die pad and electrically connecting the semiconductor chip with the lead, aligning the lead to correspond to the lower mold protrusion and setting the lead frame in the mold, injecting an encapsulating resin into the mold to form a batch sealing block, and dividing the batch sealing block into individual pieces.

By using the above-described methods, a semiconductor device having a small mounting area while a lead is prevented from falling off from an encapsulating resin and a manufacturing method thereof can be obtained.

DESCRIPTION OF THE EMBODIMENTS

Hereinafter, a semiconductor device according to embodiments of the invention will be described with reference to the drawings.

First Embodiment

Figure 1A:
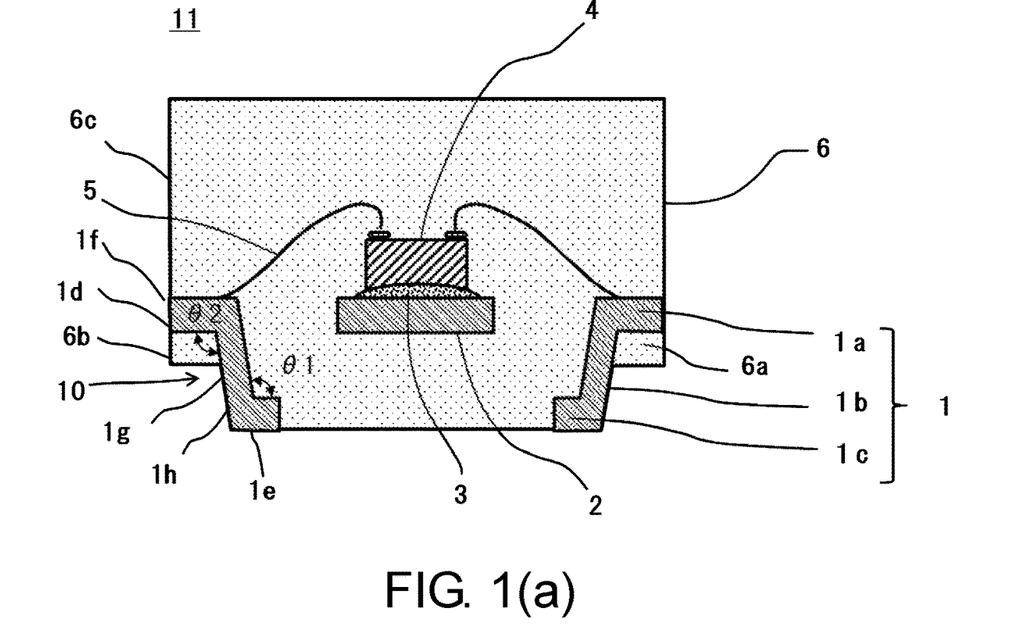
FIG. 1(a) and FIG. 1(b) are respectively a cross-sectional view and a side view of a semiconductor device according to a first embodiment.
Figure 1B:
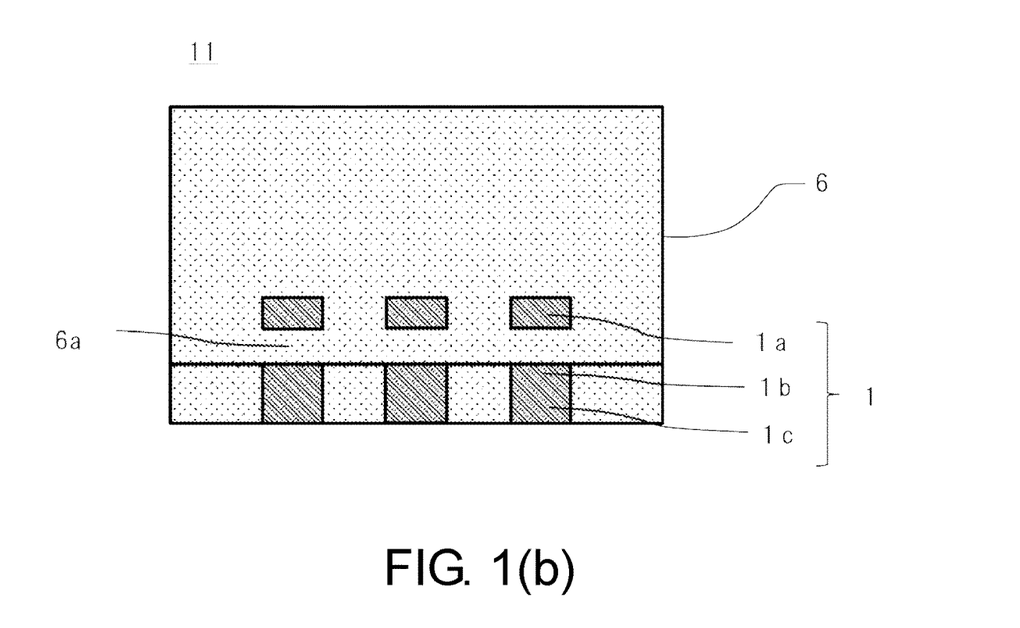

FIG. 1(a) is a cross-sectional view of a semiconductor device according to the first embodiment, and FIG. 1(b) is a side view thereof.

As illustrated in FIG. 1(a), a semiconductor chip 4 bonded and mounted on a die pad 2 with a die attach agent 3 is connected to an upper surface of an inner lead part 1a of a lead 1 by a bonding wire 5. The lead 1 is constituted by an outer lead part 1c provided horizontally, a lead leg part 1b extending from the outer lead part 1c and standing up on the outer lead part, and an inner lead part 1a extending from the lead leg part 1b and provided parallel to the outer lead part 1c. That is, the lead 1 has a configuration in which the inner lead part 1a and the outer lead part 1c provided parallel to each other are connected by the lead leg part 1b in an oblique or vertical shape, and the outer lead part 1c is positioned on an inner side of a semiconductor device 11 with respect to the inner lead part 1a in a plan view.

Then, the die pad 2, the semiconductor chip 4, the bonding wire 5, and a portion of the lead 1 are sealed with an encapsulating resin 6. A bottom surface 1e of the outer lead part 1c is formed on the same plane as a bottom surface of the encapsulating resin 6 and exposed from the encapsulating resin 6. Also, an outer side surface 1h of the outer lead part 1c and an outer side surface 1g of the lead leg part 1b are also exposed from the encapsulating resin 6. A support resin part 6a which is a portion of the encapsulating resin 6 is in contact with a bottom surface 1d of the inner lead part 1a. A region surrounded by a bottom surface 6b of the support resin part 6a, the outer side surface 1h of the outer lead part 1c, and the outer side surface 1g of the lead leg part 1b is a notch part 10 where the encapsulating resin 6 is absent, and the bottom surface 6b of the support resin part 6a, the outer side surface 1h of the outer lead part 1c, and the outer side surface 1g of the lead leg part 1b directly define the shape of the notch part 10. Further, an outer side surface 1f of the inner lead part 1a is also exposed from the encapsulating resin 6. Here, a side surface 6c of the encapsulating resin 6 and the outer side surface 1f of the inner lead part 1a are formed on the same plane, or the outer side surface 1f of the inner lead part 1c is formed to be somewhat recessed with respect to the side surface 6c of the encapsulating resin.

The lead 1 has two bent portions. A first bent portion is a boundary between the outer lead part 1c and the lead leg part 1b and an angle θ1 formed by the two is 90° to 140°, and a second bent portion is a boundary between the lead leg part 1b and the inner lead part 1a and an angle θ2 formed by the two is 90° to 140°. The bent angles θ1 and θ2 are at positions of alternate angles of parallel lines and are always the same. Further, although not illustrated, the bottom surface 1e of the outer lead part 1c, the outer side surface 1h of the outer lead part 1c, and the outer side surface 1g of the lead leg part 1b are coated with a plating film so that bonding at the time of mounting is satisfactory.

FIG. 1(b) is a side view when viewed from a lateral side of FIG. 1(a). Three leads 1 are exposed on one surface, and the semiconductor device 11 has six leads 1 together with leads on the opposite surface. The number of leads 1 may be two, four, or eight disposed at symmetrical positions on both sides of the die pad. The bottom surface of the outer lead 1c is exposed on the bottom surface of the encapsulating resin 6, and some of the lead leg part 1b and the inner lead part 1a are also exposed from the encapsulating resin 6 on a side surface of the encapsulating resin 6. Also, not only is the support resin part 6a which is a portion of the encapsulating resin 6 formed on a bottom surface of the inner lead part 1a but also a periphery thereof is covered with the encapsulating resin 6, and thereby the lead 1 is prevented from falling off from the encapsulating resin 6. In a conventional semiconductor device, a thin overhanging part has been provided to prevent the lead from falling off from the encapsulating resin, but in the semiconductor device according to the embodiment of the invention, the lead can be prevented from falling off without providing an overhanging part.

FIG. 2(a) to FIG. 2(c) and FIG. 3(a) to FIG. 3(c) are cross-sectional views illustrating a manufacturing method of the semiconductor device according to the first embodiment.

Figure 2A:
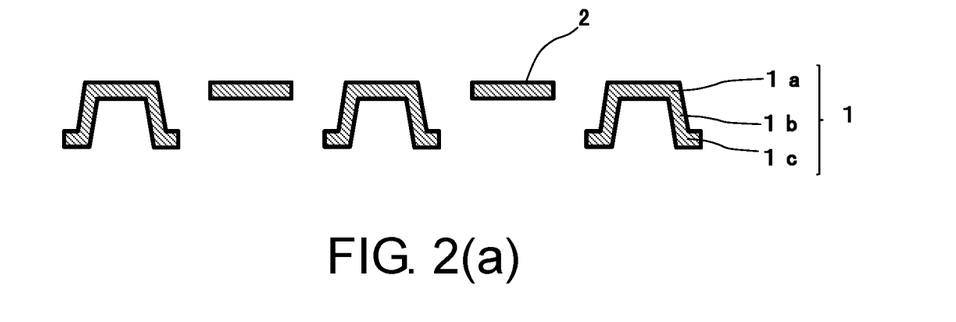
FIG. 2(a) to FIG. 2(c) are cross-sectional views illustrating a manufacturing method of the semiconductor device according to the first embodiment.

First, as illustrated in FIG. 2(a), a molded lead frame including at least the die pad 2 and the lead 1 is prepared as a lead frame. The lead 1 is formed by joining adjacent leads 1 and has an isosceles trapezoidal shape in which an upper base is shorter than a lower base, and a portion corresponding to the upper base of the trapezoid corresponds to the inner lead part 1a and a portion corresponding to the leg part of the trapezoid corresponds to the lead leg part 1b. Also, a horizontal portion extending outward from a bottom of the lead leg part 1b is the outer lead part 1c. Further, although a height position of the die pad 2 is illustrated to be the same as a height position of the inner lead part 1a, it is not limited thereto.

Figure 2B:
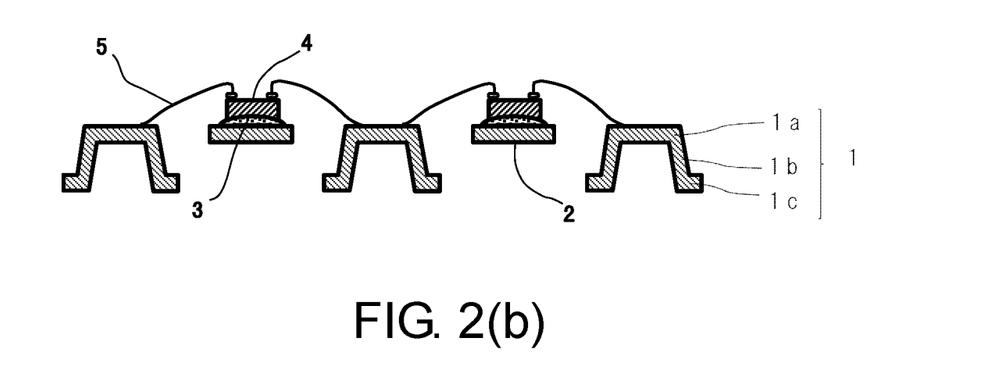

Next, as illustrated in FIG. 2(b), the semiconductor chip 4 is bonded onto the die pad 2 with the die attach agent 3 such as a silver paste interposed therebetween. Then, an electrode pad on a surface of the semiconductor chip 4 and the inner lead part 1a are electrically connected by the bonding wire 5. At least two bonding wires are connected to one lead 1 in a trapezoidal shape from both the left and right semiconductor chips 4.

Figure 2C:
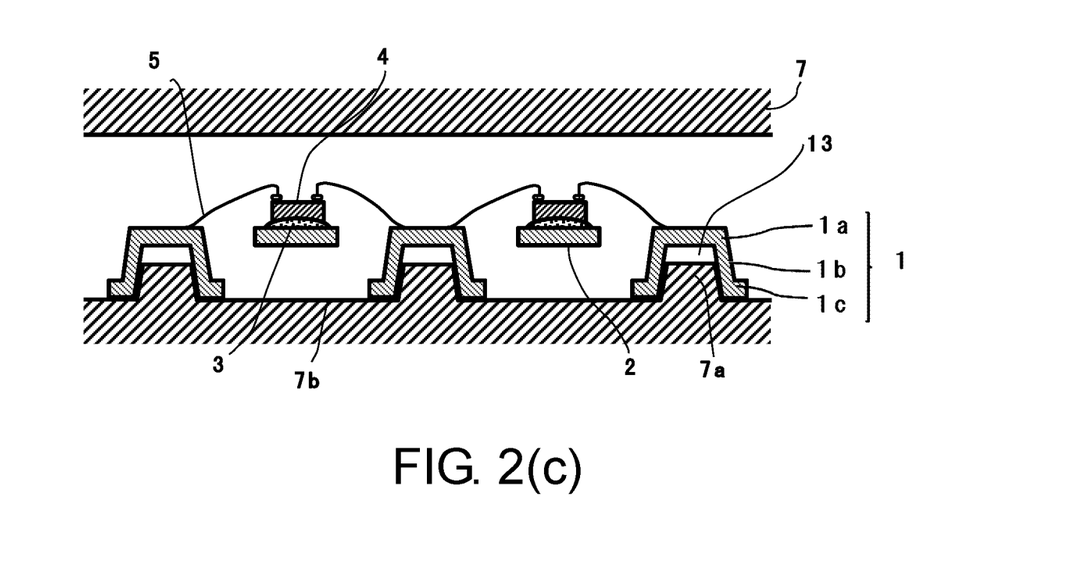

Next, as illustrated in FIG. 2(c), the lead frame is set in a mold 7 having a cavity relatively large area capable of batch-sealing a plurality of semiconductor chips 4. The mold 7 is constituted from two molds 7, an upper mold and a lower mold, lower mold protrusions 7a disposed at a predetermined interval are provided on an upper surface of the lower mold, a disposition interval thereof is the same as an interval between the lead 1 and an adjacent lead 1, and the leads 1 are set on the lower mold protrusions 7a to be fitted and superimposed thereon. A bottom surface of the outer lead part 1c of the lead 1 is in contact with a cavity bottom surface 7b, and side surfaces of the lead leg part 1b and the outer lead part 1c are brought into close contact with an inclined side surface of the lower mold protrusion 7a. Also, an upper surface of the lower mold protrusion 7a is a flat surface, and a gap 13 is formed between the upper surface of the lower mold protrusion 7a and the bottom surface of the inner lead part 1a.

Figure 3A:
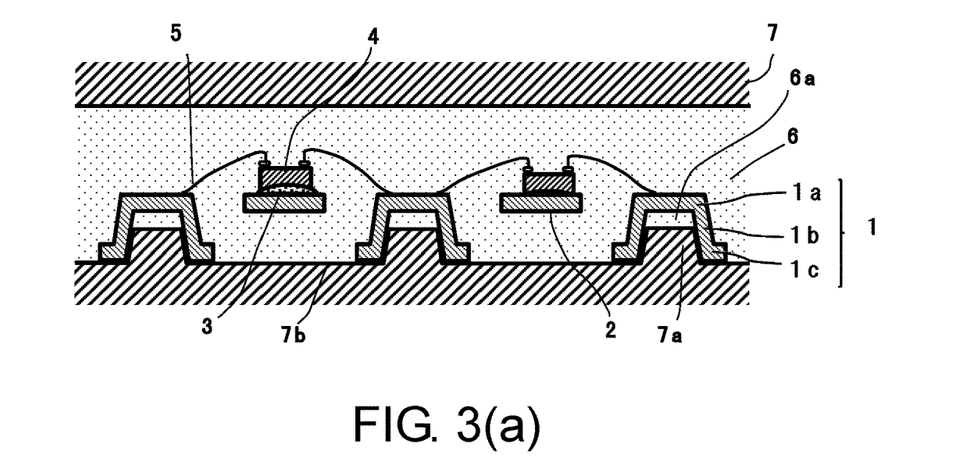
FIG. 3(a) to FIG. 3(c) are cross-sectional views illustrating the manufacturing method of the semiconductor device according to the first embodiment, following FIG. 2(a) to FIG. 2(c).

As illustrated in FIG. 3(a), after the lead frame is installed in the mold 7, an encapsulating resin is injected to flow into the cavity of the mold 7 for batch-resin-sealing and then hardening progresses, and thereby a batch sealing block 20 is formed. The encapsulating resin 6 enters the gap 13 between the upper surface of the lower mold protrusion 7a and the bottom surface of the inner lead part 1a to form the support resin part 6a.

Figure 3B:
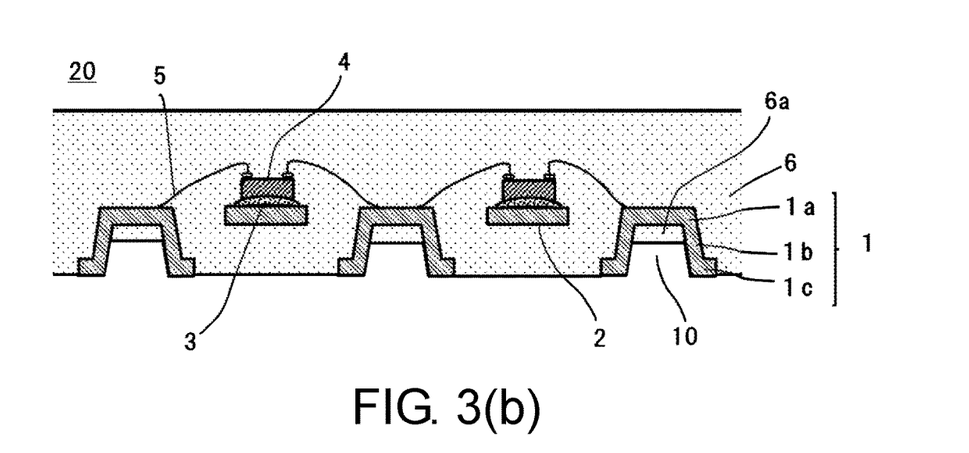

As illustrated in FIG. 3(b), after hardening of the resin, the lead frame on which the encapsulating resin 6 has been formed is released from the mold 7. In the lead frame after the batch-resin-sealing, the notch part 10 has been formed along a shape of the lower mold protrusion 7a provided in the mold 7. The support resin part 6a covers an upper portion of the lead leg part 1b with the encapsulating resin 6, and in the notch part 10 formed thereunder, an outer side surface of a lower portion of the lead leg part 1b is exposed from the encapsulating resin 6.

Figure 4:
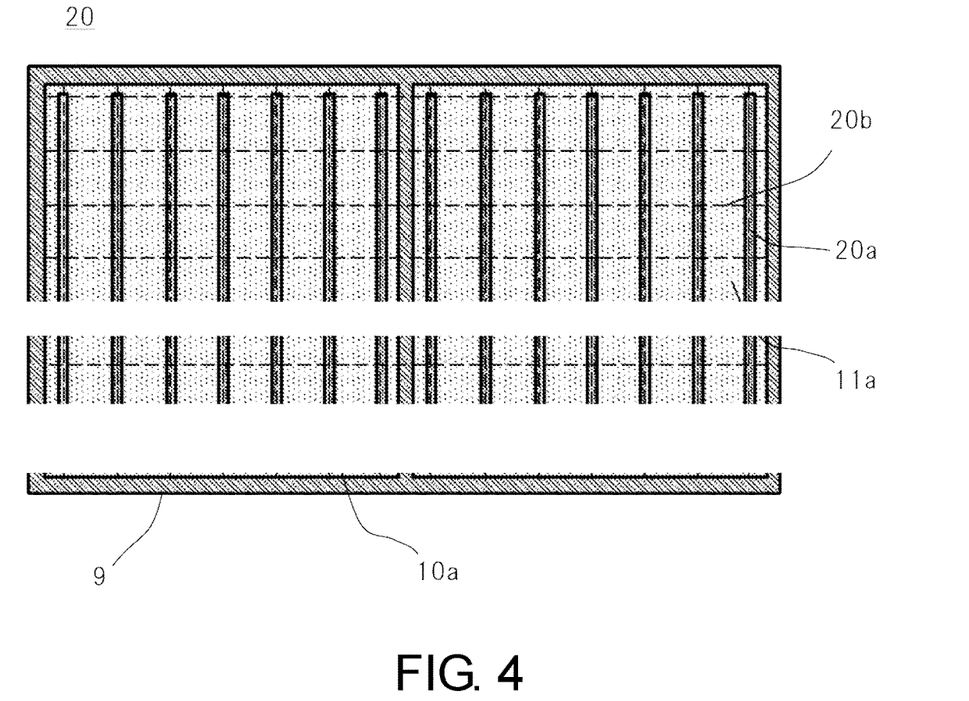
FIG. 4 is a bottom view illustrating the manufacturing method of the semiconductor device according to the first embodiment.

FIG. 4 is a bottom view illustrating the manufacturing method of the semiconductor device according to the first embodiment corresponding to FIG. 3(b). A batch sealing block 20 is made of the encapsulating resin 6 surrounded by a frame 9 of the lead frame, and a groove-shaped notch part 10a is provided on a back surface of the encapsulating resin 6. The boundary lines 20a and 20b illustrated in FIG. 4 indicate boundaries at the time of subsequent cutting, one boundary line 20a is provided along the groove-shaped notch part 10a, and the other boundary line 20b is provided to traverse the groove-shaped notch part 10a and the encapsulating resin 6. A unit part 11a partitioned by the boundary lines 20a and 20b becomes a semiconductor device later. A lead, which is not illustrated, is provided and exposed along the groove-shaped notch part 10a where the encapsulating resin 6 is absent.

In a conventional method of manufacturing a thin and large area of the batch sealing block 20 is sealed by resin at one time, the lead frame after hardening of the resin is warped due to shrinkage of the resin. Since the lead frame in which warpage has occurred is not flat, it is difficult to put the lead frame into the subsequent assembly process, and relief of the warpage is indispensable. On the other hand, in the case of the batch sealing block 20 in the manufacturing method of the semiconductor device according to the first embodiment, since a plurality of groove-shaped notch parts 10a are formed repeatedly in one direction of the lead frame, the shrinkage of the batch sealing block 20 is divided by the groove-shaped notch parts 10a and the warpage of the lead frame after hardening of the resin is alleviated.

Figure 3C:
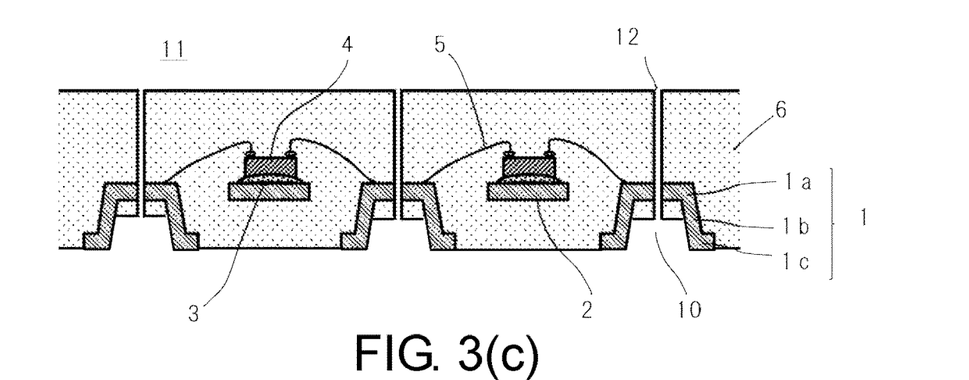

Then, as illustrated in FIG. 3(c), the batch sealing block is cut from an upper surface to the support resin part 6a and divided into individual pieces of the semiconductor devices 11 by using a dicing blade. Metal burrs may occur in the vicinity of a cut surface of the inner lead part 1a due to the dicing blade in some cases and when the occurrence of metal burrs is likely to cause short-circuiting with an adjacent lead 1, etching may be performed as post-processing. When a material of the lead 1 is copper, a sulfuric acid/hydrogen peroxide solution or an aqueous ferric chloride solution may be used as an etchant. By using these etchants, copper can be selectively etched without etching the encapsulating resin 6.

Figure 5:
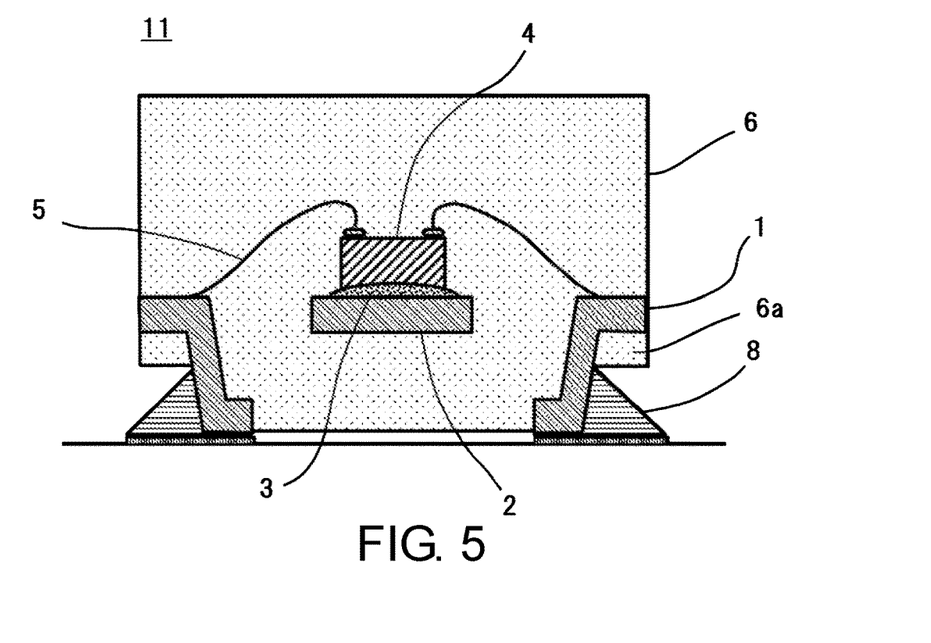
FIG. 5 is a mounted cross-sectional view of the semiconductor device according to the first embodiment.

FIG. 5 is a mounted cross-sectional view of the semiconductor device according to the first embodiment. When the semiconductor device 11 is fixed by solder to a circuit board, the solder creeps up from the outer side surface 1h of the outer lead part 1c to the outer side surface 1g of the lead leg part 1b, and a solder fillet 8 is formed up to a region reaching a bottom surface of the support resin part 6a. When the solder fillet 8 is formed in this manner, the semiconductor device 11 is satisfactorily bonded to the circuit board. Also, in the semiconductor device 11, since the inner lead part 1a is formed on a side away from a center of the semiconductor device 11 and the outer lead part 1c is formed on an inward side via the lead leg part 1b which is inclined toward the inner side, an outer end of the solder fillet 8 does not protrude greatly from the semiconductor device 11 even in a state in which the solder fillet 8 sufficient for bonding is formed, and the mounting area becomes small compared to a conventional mounting area. The mounting area tends to become smaller as the bent angles θ1 and θ2 of the lead in the semiconductor device 11 illustrated in FIG. 1 become larger.

Next, explanation is given to the second embodiment of the present invention.

Second Embodiment

Figure 6:
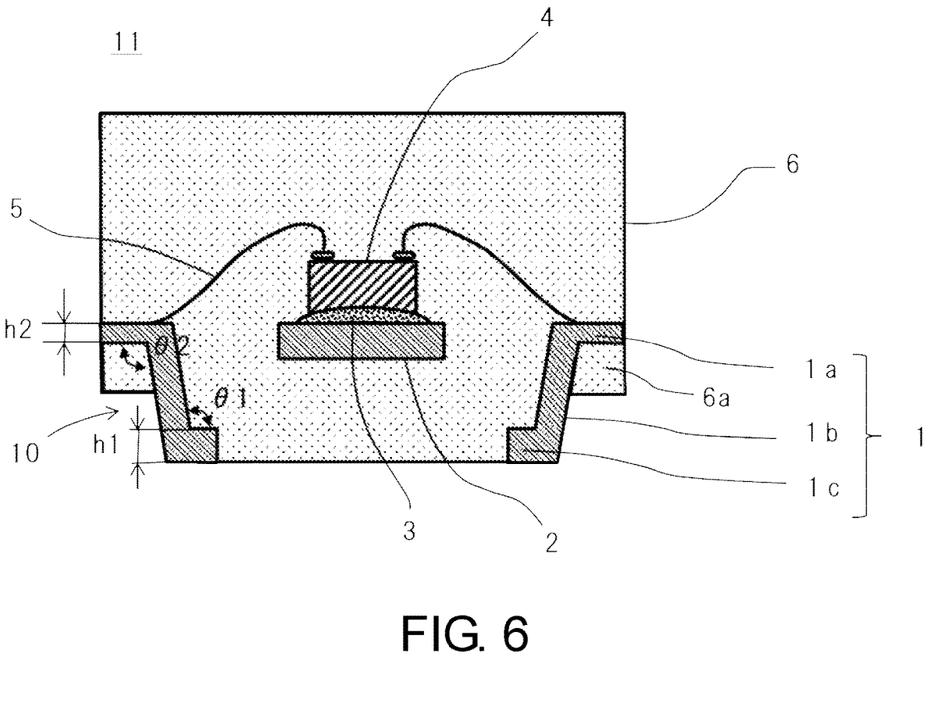
FIG. 6 is a cross-sectional view of a semiconductor device according to a second embodiment.

FIG. 6 is a cross-sectional view of a semiconductor device according to the second embodiment. A difference from the semiconductor device according to the first embodiment illustrated in FIG. 1 is that a thickness h2 of an inner lead part 1a is thinner compared to a thickness h1 of an outer lead part 1c and is about ½ to ⅓ of the lead thickness of the outer lead part 1c. Such a lead 1 can be obtained by vertically pressing the inner lead part 1a after bending a lead 1 in preparing a molded lead frame illustrated in FIG. 2(a). When the inner lead part 1a is made thin, the number of metal burrs occurring in dividing into individual pieces in FIG. 3(c) is reduced and etching of the post-processing can be reduced.

In the above description, although the vertical pressing of the inner lead part 1a is performed by subjecting the entire surface of the inner lead part 1a to one-step press, by performing a second step of pressing on a portion corresponding to a cutting groove 12 with a dicing blade, a portion in which the inner lead part 1a is exposed from the encapsulating resin 6 is further thinned and occurrence of metal burrs can be reduced in quantity.

According to the above-described manufacturing method of the semiconductor device, the semiconductor device 11 having a relatively small mounting area while the lead 1 is prevented from falling off from the encapsulating resin 6 can be realized. Further, since warpage of the molded batch sealing block 20 can be alleviated, it can be put into the subsequent assembly process after the resin-sealing process without a dedicated process for the warpage.

The semiconductor device according to the embodiments of the invention can be used for portable toys, healthcare products, wearable terminals, mobile terminals, home appliances, and the like. Further, it can be applied to automotive applications in which an operating environment is severe and to outdoor applications.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A semiconductor device comprising:
 a die pad;
 a semiconductor chip mounted on the die pad;
 a lead having an outer lead part and an inner lead part which is set up by a lead leg part extending from the outer lead part, wherein the inner lead part extends from the lead leg part toward outside of the semiconductor device;
 an encapsulating resin sealing the die pad, the semiconductor chip, and the lead so that the lead is partially exposed;
 a support resin part provided on a bottom surface of the inner lead part, the support resin part being a portion of the encapsulating resin; and
 a notch part where the encapsulating resin is absent, locating in a region surrounded by a bottom surface of the support resin part, an outer side surface of the outer lead part facing the outside of the semiconductor device, and an outer side surface of the lead leg part facing the outside of the semiconductor device, wherein the notch part is located outside of the outer side surface of the outer lead part and the outer side surface of the lead leg part.

2. The semiconductor device according to claim 1, wherein a thickness of the inner lead part is thinner than a thickness of the outer lead part.

3. The semiconductor device according to claim 1, wherein the lead leg part is provided perpendicular to a bottom surface of the outer lead part.

4. The semiconductor device according to claim 2, wherein the lead leg part is provided perpendicular to a bottom surface of the outer lead part.

5. The semiconductor device according to claim 1, wherein the lead leg part is inclined with respect to a bottom surface of the outer lead part.

6. The semiconductor device according to claim 2, wherein the lead leg part is inclined with respect to a bottom surface of the outer lead part.

7. The semiconductor device according to claim 1, wherein a plating film is provided on a bottom surface and the outer side surface of the outer lead part and the outer side surface of the lead leg part.

8. The semiconductor device according to claim 2, wherein a plating film is provided on a bottom surface and the outer side surface of the outer lead part and the outer side surface of the lead leg part.

9. The semiconductor device according to claim 3, wherein a plating film is provided on the bottom surface and the outer side surface of the outer lead part and the outer side surface of the lead leg part.

10. The semiconductor device according to claim 4, wherein a plating film is provided on the bottom surface and the outer side surface of the outer lead part and the outer side surface of the lead leg part.

11. The semiconductor device according to claim 5, wherein a plating film is provided on the bottom surface and the outer side surface of the outer lead part and the outer side surface of the lead leg part.

12. The semiconductor device according to claim 6, wherein a plating film is provided on the bottom surface and the outer side surface of the outer lead part and the outer side surface of the lead leg part.

* * * * *